(12) United States Patent
Saito et al.

(10) Patent No.: US 9,159,615 B2
(45) Date of Patent: Oct. 13, 2015

(54) GRAPHENE INTERCONNECTION AND METHOD OF MANUFACTURING THE SAME

(75) Inventors: Tatsuro Saito, Yokohama (JP); Makoto Wada, Yokohama (JP); Akihiro Kajita, Yokohama (JP); Atsuko Sakata, Yokohama (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 890 days.

(21) Appl. No.: 13/216,435

(22) Filed: Aug. 24, 2011

(65) Prior Publication Data

US 2012/0080661 A1    Apr. 5, 2012

(30) Foreign Application Priority Data

Oct. 5, 2010  (JP) ................................. 2010-225777

(51) Int. Cl.
*H01L 23/532*  (2006.01)
*H01L 21/768*  (2006.01)

(52) U.S. Cl.
CPC .... *H01L 21/76885* (2013.01); *H01L 21/76876* (2013.01); *H01L 21/76877* (2013.01); *H01L 21/76879* (2013.01); *H01L 21/76883* (2013.01); *H01L 23/53276* (2013.01); *H01L 2221/1094* (2013.01)

(58) Field of Classification Search
CPC ............ H01L 21/76879; H01L 23/522; H01L 2221/1094
USPC ..................... 257/750–758, E23.165, 24, 222
See application file for complete search history.

(56) References Cited

U.S. PATENT DOCUMENTS

| 8,358,008 B2 * | 1/2013 | Wada et al. .................. 257/750 |
| 2006/0281306 A1 | 12/2006 | Gstrein et al. |
| 2011/0006425 A1 | 1/2011 | Wada et al. |
| 2011/0101528 A1 | 5/2011 | Akimoto et al. |

FOREIGN PATENT DOCUMENTS

| JP | 2002-110784 | 4/2002 |
| JP | 2006-120730 | 5/2006 |
| JP | 2009-070911 | 4/2009 |
| JP | 2009-164432 A | 7/2009 |
| JP | 2010-062333 A | 3/2010 |
| JP | 2010-212619 A | 9/2010 |
| TW | 200710258 | 3/2007 |

OTHER PUBLICATIONS

Japanese Office Action issued on Feb. 4, 2014 in corresponding Japanese Application No. 2010-225777, along with English translation.

(Continued)

*Primary Examiner* — Cuong Q Nguyen
(74) *Attorney, Agent, or Firm* — White & Case LLP (57) ABSTRACT

According to one embodiment, a graphene interconnection includes an insulating film, a catalyst film, and a graphene layer. An insulating film includes an interconnection trench. A catalyst film is formed in the interconnection trench and filling at least a portion of the interconnection trench. A graphene layer is formed on the catalyst film in the interconnection trench, and including graphene sheets stacked in a direction perpendicularly to a bottom surface of the interconnection trench.

20 Claims, 11 Drawing Sheets (56) References Cited

OTHER PUBLICATIONS

Taiwanese Office Action mailed on Dec. 24, 2013 in corresponding Taiwanese Application No. 100132452, along with English translation thereof.
Korean Office Action for Korean Application No. 10-2011-93135 mailed on Nov. 12, 2012.
Xu, Chuan, et al., "Modeling, Analysis, and Design of Graphene Nano-Ribbon Interconnects", IEEE Transactions on Electron Devices, vol. 56, No. 8, Aug. 2009, pp. 1567-1578.
Byung Jim Kang, et al., "Monolayer graphene growth on sputtered thin film platinum", Journal of Applied Physics, 106, 104309-1-6, 2009.

* cited by examiner

GRAPHENE INTERCONNECTION AND METHOD OF MANUFACTURING THE SAME

CROSS-REFERENCE TO RELATED APPLICATIONS

This application is based upon and claims the benefit of priority from prior Japanese Patent Application No. 2010-225777, filed Oct. 5, 2010, the entire contents of which are incorporated herein by reference.

FIELD

Embodiments described herein relate generally to a graphene interconnection and a method of manufacturing the same.

BACKGROUND

Recently, a method of applying a carbon-based material as a low-resistance material to an interconnection is extensively studied worldwide. A typical carbon-based material expected to have a low resistance is a carbon nanotube (CNT). The CNT achieves various quantum effects in accordance with the differences between various nanostructures, and can be formed into an insulator, semiconductor, or conductor. Especially when the CNT is formed as a conductor, quantum conduction (ballistic conduction) is expected. This makes the CNT usable as an ultra-low-resistance material replacing the existing metallic material (for example, a Cu interconnection). Also, the CNT can be expected to be advantageous for electrical conduction of a long-distance interconnection because the ballistic length is large.

Unfortunately, it is very difficult to uniformly grow the CNT in the lateral direction (in-plane direction). Therefore, the CNT cannot simply be used as an interconnection material in the in-plane direction. In addition, the CNT is difficult to bend. This makes it impossible to form, for example, an interconnection bending structure by using the CNT, and imposes a large limitation on the layout of patterns.

On the other hand, a method of applying graphene, as a material having a quantum conduction characteristic similar to that of the CNT, to an interconnection material is extensively studied. Graphene is a novel carbon material obtained by extremely thinning graphite. Accordingly, similar to the CNT, graphene is expected to be used as an LSI low-resistance interconnection replacing a metal interconnection due to quantum conduction. Also, graphene has a very large ballistic length, and hence is advantageous for electrical conduction of a long-distance interconnection. Furthermore, since a graphene structure itself is a very thin film (single-layered film), the film can be deposited by chemical vapor deposition (CVD). That is, graphene well matches the formation process of lateral interconnections of devices.

The resistance of a graphene interconnection is determined by the quantum resistance per graphene sheet, and the number of stacked graphene sheets. That is, the resistance increases when the number of stacked graphene sheets is small, and decreases when the number of stacked graphene sheets is large. However, low-resistance conduction is difficult for the conventional graphene interconnection because the number of stacked graphene sheets is limited.

As described above, demands have arisen for a further decrease in resistance of the graphene interconnection.

BRIEF DESCRIPTION OF THE DRAWINGS

FIGS. 2A-4B are sectional views showing the manufacturing steps of the graphene interconnection according to the first embodiment;

FIGS. 5A-7 are sectional views showing manufacturing steps in a modification of the graphene interconnection according to the first embodiment;

DETAILED DESCRIPTION

In general, according to one embodiment, a graphene interconnection includes: an insulating film; a catalyst film; and a graphene layer. An insulating film includes an interconnection trench. A catalyst film is formed in the interconnection trench and filling at least a portion of the interconnection trench. A graphene layer is formed on the catalyst film in the interconnection trench, and including graphene sheets stacked in a direction perpendicularly to a bottom surface of the interconnection trench.

Embodiments will be explained below with reference to the accompanying drawing. In the drawing, the same reference numbers denote the same parts.

<First Embodiment>

A graphene interconnection according to the first embodiment will be explained below with reference to FIGS. 1A to 4B. The first embodiment is an example in which a plurality of graphene sheets are stacked on a catalyst film formed in an interconnection trench.

[Structure]

Figure 1A:
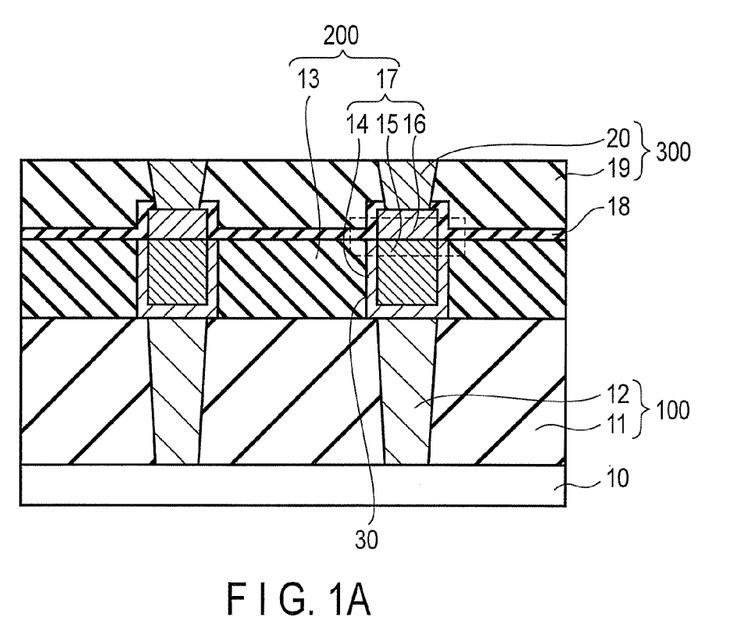
FIGS. 1A and 1B are sectional views showing the structure of a graphene interconnection according to the first embodiment.
Figure 1B:
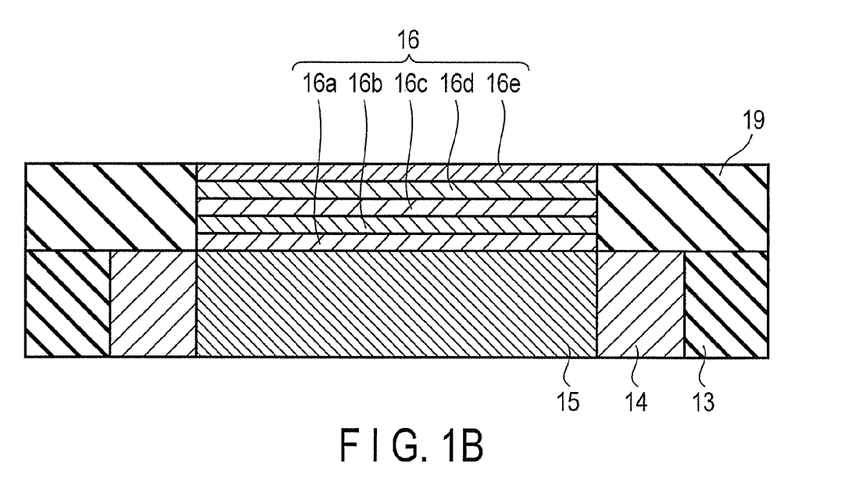

FIG. 1A is a sectional view of the graphene interconnection and FIG. 1B is an enlarged view of a dotted-line portion shown in FIG. 1A. Note that a cap film 18 (described later) is not shown in FIG. 1B.

As shown in FIG. 1A, as an example of an interconnection structure, a first contact layer 100, interconnection layer 200, and second contact layer 300 are formed on a substrate 10 in which a semiconductor element (not shown) such as a transistor or capacitor is formed.

The first contact layer 100 is formed on the substrate 10. The first contact layer 100 includes a first contact layer insulating film 11 and first contact plugs 12.

The first contact layer insulating film 11 is formed on the substrate 10 and contains for example, tetraethoxysilane (TEOS). The first contact plug 12 is formed in the first contact layer insulating film 11, and electrically connects the semiconductor element formed in the substrate 10 and the interconnection layer 200 (described later). The conductive material of the first contact plug 12 is a metal such as W, Cu, or Al.

To prevent the diffusion of the conductive material metal of the first contact plug 12, it is also possible to form a barrier metal (not shown) between the first contact plug 12 and the first contact layer insulating film 11 and between the first contact plug 12 and substrate 10. The barrier metal is, for example, Ta, Ti, Ru, Mn, or Co, or a nitride of any of these metals. In addition, a stopper film (not shown) is formed on the contact layer 100 by using a material such as SiCN having a high processing selectivity to an interconnection layer insulating film 13. Note that no stopper film need be formed if the processing selectivity between the interconnection layer insulating film 13 (described later) and first contact layer insulating film 11 is sufficiently high.

The interconnection layer 200 is formed on the first contact layer 100. The interconnection layer 200 includes the interconnection layer insulating film 13 and interconnections 17.

The interconnection layer insulating film 13 is formed on the first contact layer 100 by using, for example, SiOC. A plurality of interconnection trenches 30 are formed in the interconnection layer insulating film 13 so as to open the portions of the first contact plugs 12. The interconnection layer insulating film 13 may also be a film including pores (microscopic hollows) in order to decrease the dielectric constant.

The interconnection 17 is formed along each interconnection trench 30 formed in the interconnection layer insulating film 13. Details of the interconnection 17 will be described later.

The cap film 18 as a protective film is formed on the interconnection layer insulating film 13. The cap film 18 is, for example, SiN or SiCN, and has holes in regions where second contact plugs 20 (described later) are to be formed. The cap film 18 prevents the diffusion of the material forming the interconnection layer 200 to the outside, and prevents the oxidation of the material forming the interconnection layer 200. However, the cap film 18 need not always be formed because a graphene layer (described later) itself is a stable material and has a high oxidation resistance. The cap film 18 can also function as a control layer for etching processing of the second contact layer 300.

The second contact layer 300 is formed on the interconnection layer 200. The second contact layer 300 has the same structure as that of the first contact layer 100, and includes a second contact layer insulating film 19 and the second contact plugs 20.

The second contact layer insulating film 19 is formed on the cap film 18 on the interconnection layer 200 by using, for example, TEOS. The second contact plug 20 is formed in the second contact layer insulating film 19, and electrically connects the interconnection layer 200 and an interconnection layer (not shown) formed on the second contact layer 300.

The interconnection 17 according to this embodiment will be explained below. The interconnection 17 according to this embodiment is formed along each interconnection trench 30, and includes a catalyst underlying film 14, catalyst film 15, and graphene layer 16. Note that in the drawing, the interconnection 17 extends in the direction perpendicular to the drawing surface, and an electric current flows in this direction.

The catalyst underlying film 14 is formed on the both side surfaces and bottom surface of the interconnection trench 30. More specifically, the catalyst underlying film 14 is formed on the interconnection layer insulating film 13 on the both side surfaces of the interconnection trench 30, and on the first contact plug 12 as the bottom surface of the interconnection trench 30. That is, the catalyst underlying film 14 is directly connected to the first contact plug 12. The catalyst underlying film 14 functions as an auxiliary film for facilitating the formation of the graphene layer 16 (described later). Also, the catalyst underlying film 14 prevents the diffusion of the catalyst film 15 (described later) to the interconnection layer insulating film 13. That is, the catalyst underlying film 14 is a film having an auxiliary catalytic action and diffusion barrier properties.

The catalyst underlying film 14 is a film of, for example, TaN, TiN, RuN, WN, Ta, Ti, Ru, or W, or a film of an oxide of any of these materials. It is also possible to stack films of these materials as the catalyst underlying film 14. In particular, to promote the uniform growth of the graphene layer 16, the catalyst underlying film 14 is desirably a multilayered film of a TaN film and TiN film. The film thickness of the catalyst underlying film 14 is, for example, about 1 nm. Note that the catalyst underlying film 14 is desirably deposited to facilitate the formation of the graphene layer 16, but need not always be deposited because the graphene layer 16 can be grown without the catalyst underlying film 14.

The catalyst film 15 is formed on the catalyst underlying film 14 in each interconnection trench 30, and buried (filled) in the interconnection trench 30. In other words, the upper surface of the catalyst film 15 is made level with the upper surface of the interconnection trench 30 (upper surfaces of the interconnection layer insulating film 13 and catalyst underlying film 14). The catalyst film 15 is a main catalyst for growing the graphene layer 16.

The catalyst film 15 is desirably a film of a metal such as Co, Ni, Fe, Ru, or Cu, a film of an alloy containing at least one of these metals, or a film of, for example, a carbide of any of these metals. If the catalyst film 15 disperses into fine grains (a discontinuous film), the graphene layer 16 cannot well grow or may discontinuously be formed. Therefore, the catalyst film 15 is desirably a continuous film. For this purpose, the film thickness of the catalyst film 15 must be at least 0.5 nm.

The graphene layer 16 is formed on the catalyst film 15 in each interconnection trench 30, and protrudes from the interconnection trench 30. In other words, the lower surface of the graphene layer 16 is made level with or higher than the upper surface of the interconnection trench 30 (upper surface of the interconnection layer insulating film 13). The graphene layer 16 is continuously formed in the direction perpendicular to the drawing surface, and an electron transfer path (current path) is formed along the direction.

As will be described later, the graphene layer 16 includes up to about 100 graphene sheets that grow by using the catalyst film 15 as a catalyst, and has a quantum conduction characteristic. Graphene is a single-layered film of graphite, and has a structure in which carbon atoms are arranged into a hexagonal lattice shape. In the following description, graphene as a single-layered film of graphite will be referred to as a graphene sheet.

The mean free path of electrons in the graphene sheet is about 100 nm to 1 μm, and much longer than the mean free path (about 40 nm) of electrons in Cu as a low-resistance metal presently used in many LSI devices. Accordingly, the graphene sheet can be used as a low-resistance material in a conductive layer of the interconnection 17.

As shown in FIG. 1B, the graphene layer 16 includes a plurality of graphene sheets 16a to 16e vertically stacked on the catalyst film 15 in the interconnection trench 30. In other words, the surfaces of the plurality of graphene sheets 16a to 16e are formed parallel to the bottom surface of the interconnection trench 30. All the plurality of graphene sheets 16a to 16e protrude from the interconnection trench 30. Also, the lower surface of the graphene sheet 16a as the lowermost sheet of the graphene layer 16 is directly connected to the catalyst layer 15. When the graphene layer 16 includes, for example, 10 graphene sheets, the film thickness of the graphene layer 16 is about 3.4 nm. Note that the number of stacked graphene sheets in the graphene layer 16 is preferably as large as possible, provided that the graphene layer 16 has the quantum conduction characteristic.

Although FIG. 1A shows the structure including one interconnection layer, two or more interconnection layers may be formed. That is, an interconnection layer similar to the interconnection layer 200 including a plurality of graphene layers may be formed on the second contact layer 300.

[Manufacturing Method]

FIGS. 2A to 4B are sectional views of the manufacturing steps of the graphene interconnection according to the first embodiment.

Figure 2A:
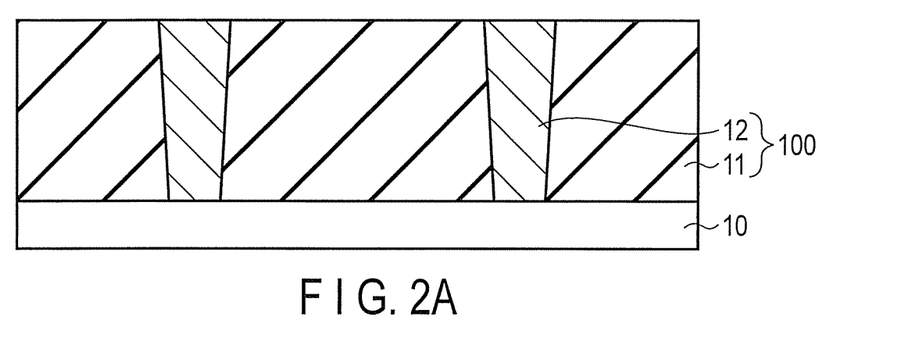

First, as shown in FIG. 2A, a first contact layer 100 is formed on a substrate 10 in which a semiconductor element (not shown) is formed. More specifically, a first contact layer insulating film 11 is formed on the substrate 10 by, for example, chemical vapor deposition (CVD), and contact holes (not shown) are formed in the first contact layer insulating film 11 by, for example, lithography. First contact plugs 12 are buried in these contact holes by, for example, CVD. In this step, a barrier metal (not shown) may be formed on the surface of each contact hole in order to prevent the diffusion of a metal as the conductive material of the first contact plug 12.

Then, a stopper film (not shown) is formed on the first contact layer 100 by, for example, CVD. This stopper film uniformizes the depth of processing of an interconnection layer insulating film 13 by reactive ion etching (RIE). Note that when the processing selectivity between the interconnection layer insulating film 13 and first contact layer 100 is sufficiently high, it is possible to sufficiently control the depth of processing of the interconnection layer insulating film 13 without any stopper film.

Figure 2B:
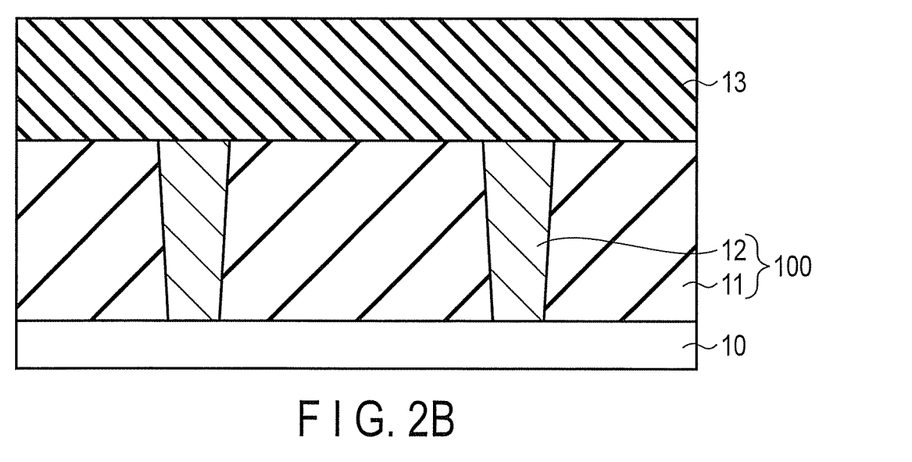

Subsequently, as shown in FIG. 2B, the interconnection layer insulating film 13 is formed on the first contact layer 100 by, for example, CVD. A cap film (not shown) serving as a protective film against damage in an RIE step and chemical mechanical polishing (CMP) step may be formed on the interconnection layer insulating film 13. No cap film need be formed if the interconnection layer insulating film 13 is a film highly resistant to damage by RIE, for example, one of TEOS, or of SiOC not including pores (microscopic air holes).

Figure 3A:
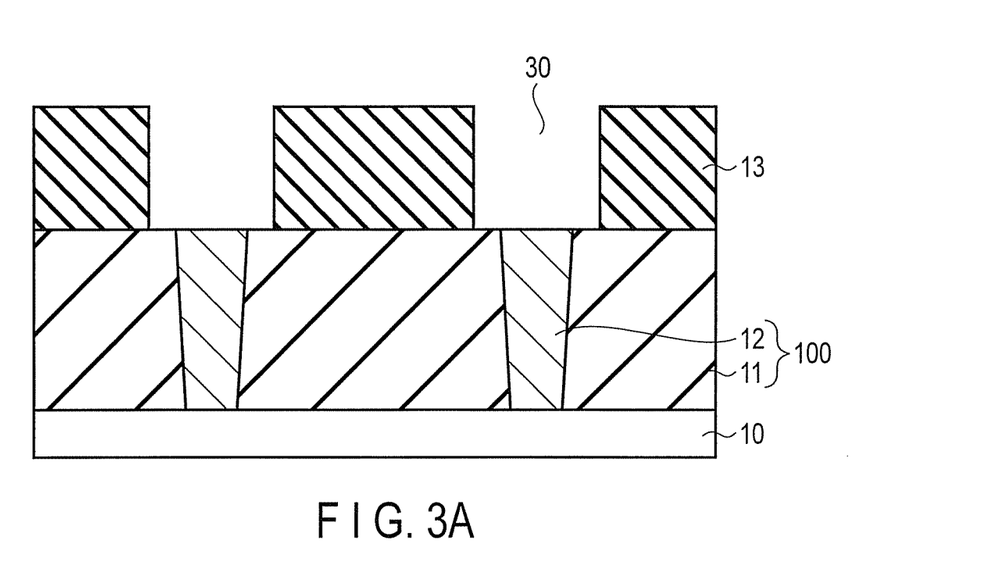

As shown in FIG. 3A, the interconnection layer insulating film 13 is coated with a resist (not shown), and a lithography step is performed. After that, interconnection trenches 30 are formed in the interconnection layer insulating film 13 by RIE, thereby forming a single-damascene interconnection structure.

Figure 3B:
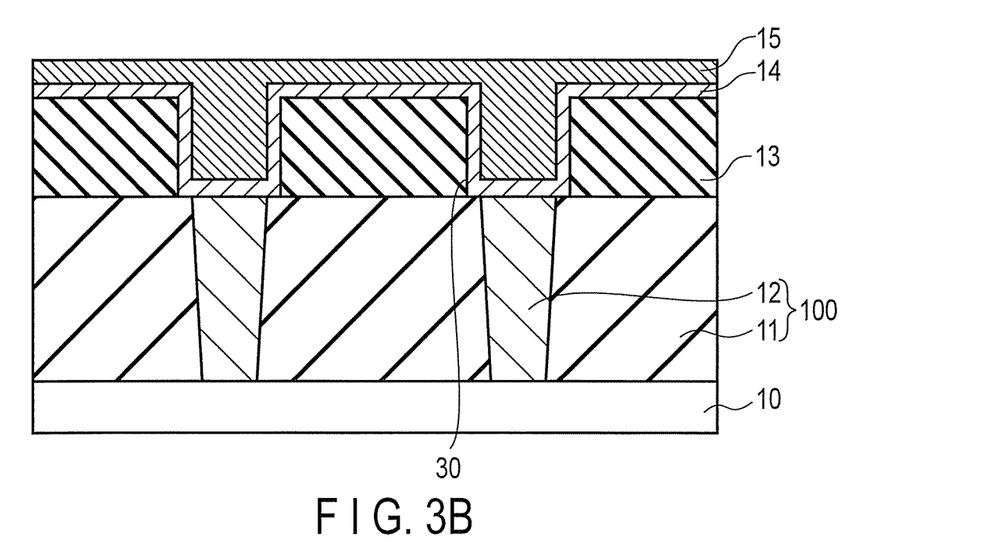

As shown in FIG. 3B, a catalyst underlying film 14 is formed on the entire surface by, for example, CVD or physical vapor deposition (PVD). More specifically, the catalyst underlying film 14 is formed on the first contact layer 100 as the bottom surface of each interconnection trench 30, on the interconnection layer insulating film 13 on the both side surfaces of each interconnection trench 30, and on the interconnection layer insulating film 13 on the upper surface outside the interconnection trenches 30 (a flat portion except for the interconnection trenches 30). Note that the catalyst underlying film 14 need not always be formed.

After that, a catalyst film 15 is formed on the entire surface by, for example, CVD, PVD, or spraying. More specifically, the catalyst film 15 is formed on the catalyst underlying film 14 inside and outside the interconnection trenches 30, and filled in the interconnection trenches 30. The catalyst film 15 is desirably formed as a continuous film.

Figure 4A:
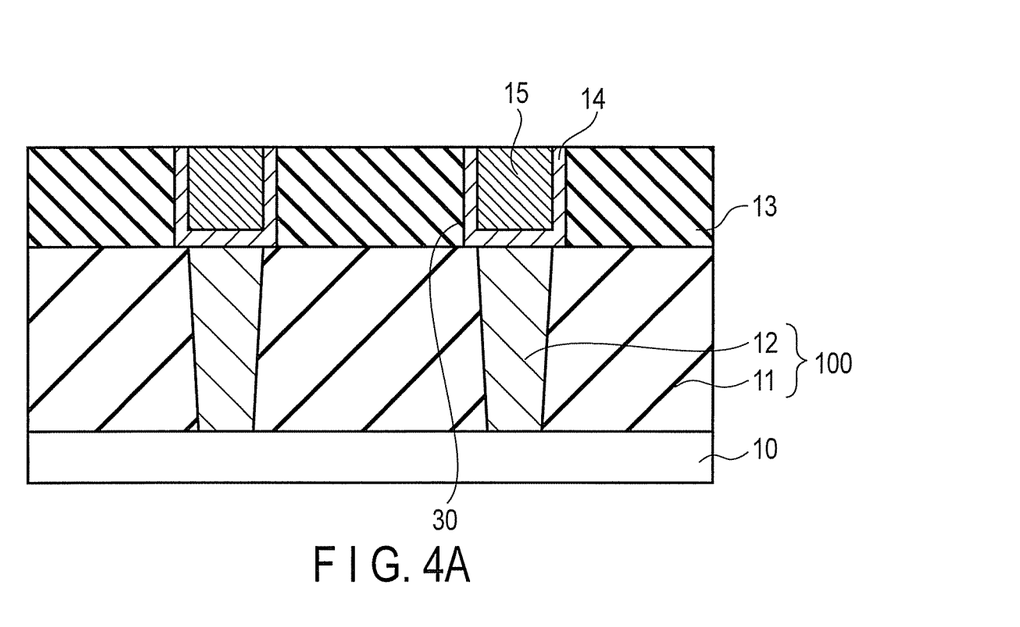

As shown in FIG. 4A, recess is performed by CMP. Consequently, the catalyst underlying film 14 and catalyst film 15 outside the interconnection trenches 30 are recessed, so the upper surfaces of the catalyst underlying film 14 and catalyst film 15 are made level with the upper surface of each interconnection trench 30 (upper surface of the interconnection layer insulating film 13). In other words, the catalyst underlying film 14 and catalyst film 15 outside the interconnection trenches 30 are removed, and the catalyst underlying film 14 and catalyst film 15 remain in each interconnection trench 30.

Figure 4B:
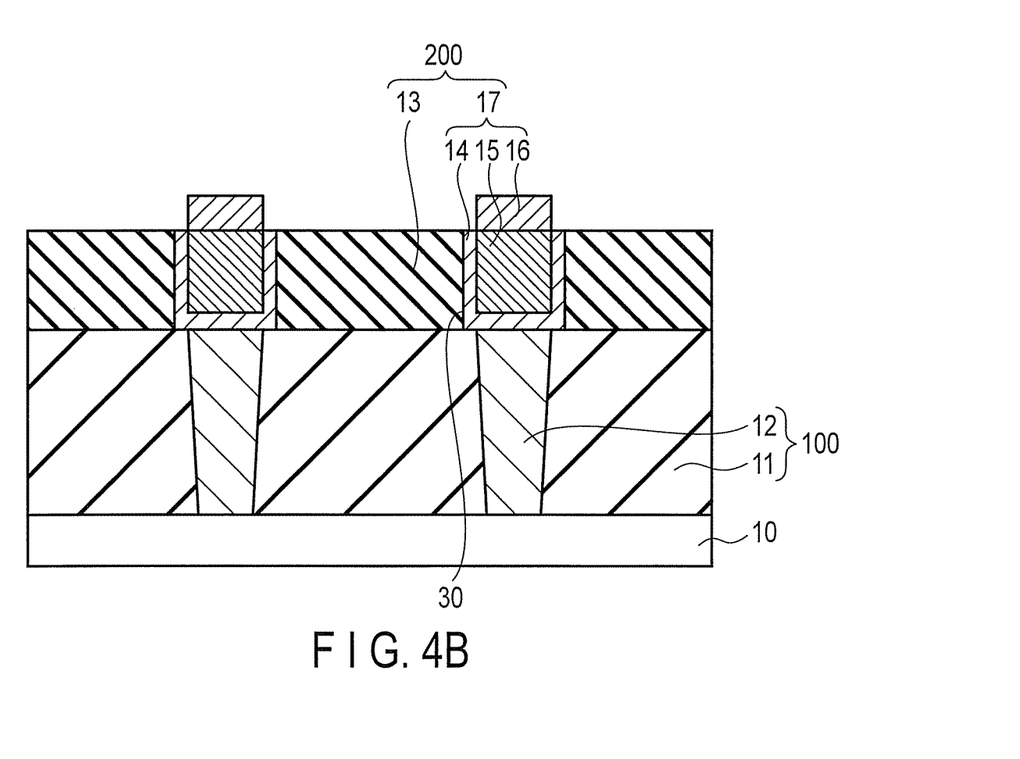

As shown in FIG. 4B, a graphene layer 16 including up to about 100 graphene sheets is formed on the catalyst film 15 in each interconnection trench 30. In other words, the graphene layer 16 is formed along each interconnection trench 30. The graphene layer 16 is extended toward a direction normal to the sheet. Since the catalyst film 15 is filled in the interconnection trench 30, the graphene layer 16 grows vertically from the upper surface of the catalyst film 15. That is, the graphene layer 16 includes a plurality of graphene sheets stacked perpendicularly to the bottom surface of each interconnection trench 30, and protrudes from the interconnection trench 30.

The graphene layer 16 is formed by, for example, CVD. A hydrocarbon gas such as methane or acetylene or a mixture containing these gases is used as a carbon source of CVD, and hydrogen or a rare gas is used as a carrier gas.

Graphene sheets can be grown by CVD under the same conditions by using these component gases, and can also be grown by multistage processing. The growth of graphene sheets by the multistage processing will be explained below.

First, before forming the graphene layer 16, plasma processing is performed on the catalyst film 15 in order to suppress the aggregation of the catalyst film 15 into fine grains. The uniform growth of the graphene layer 16 can be promoted by thus preventing the formation of fine grains of the catalyst film 15, thereby maintaining the continuity of the surface of the catalyst film 15. Although hydrogen or a rare gas is desirably used as a discharge gas, it is also possible to use a gaseous mixture containing one or both of hydrogen and a rare gas. The processing temperature is preferably as low as possible in order to increase the effect, and desirably room temperature. The plasma is desirably relatively intense, and exposure to a high-power remote plasma or plasma further increases the effect.

Then, the catalyst film 15 is carbonized by using a hydrocarbon gas such as methane or a gaseous mixture containing a hydrocarbon as a discharge gas. The processing temperature must be a temperature which is lower than the formation temperature of graphene sheets in a final step (described later) and at which graphene sheets can be formed. For example, the processing temperature is desirably about 150 to 600° C. Also, the processing time can be short. This processing is also desirably performed by using a relatively intense plasma.

Subsequently, plasma processing is performed on the catalyst film 15 in order to improve the quality of the carbonized layer and activate the catalyst. A rare gas is desirably used as a discharge gas. The processing temperature can be an intermediate temperature between the processing temperature in the preceding step and that in the succeeding step, but is not limited to this. Since a relatively weak plasma can be used in this processing, the processing is desirably performed using a remote plasma.

Finally, graphene sheets are formed by using a hydrocarbon gas or a gaseous mixture containing a hydrocarbon as a discharge gas. The upper limit of the processing temperature is about 1000° C., and the lower limit is about 200° C. If the processing temperature is lower than 200° C., a necessary growth rate cannot be obtained, so almost no graphene sheet growth occurs. At a temperature of 200° C. or higher, the growth of graphene sheets occurs, and a uniform graphene layer 16 is formed. For this purpose, the processing temperature is particularly desirably about 350° C. The processing temperature of the graphene sheet formation as described above is less than or equal to the temperature of an interconnection formation step of a normal LSI device. Accordingly, the above-described graphene sheet formation has high affinity for a semiconductor process.

In this processing, it is important to remove ions and electrons and supply only radicals to the substrate. Therefore, the use of a very weak remote plasma is desirable. It is also effective to provide an electrode on the substrate and apply a voltage in order to remove ions and electrons. This application voltage is desirably about 0 to ±100 V.

Compared to the graphene sheet formation step performed under the same conditions by CVD, the graphene sheet formation step performed by the multistage processing as described above can achieve a low formation temperature and high quality (uniform growth). The upper limit of the process temperature is preferably as low as possible, although it depends on an LSI device. That is, the overall characteristics of an LSI device can be improved by decreasing the graphene sheet formation temperature. Also, the achievement of high quality (uniform growth) of graphene sheets facilitates electrical conduction, and can implement a low-resistance interconnection.

As described above, the interconnection layer 200 including the interconnection 17 including the catalyst underlying film 14, catalyst film 15, and graphene layer 16 is formed.

Then, as shown in FIG. 1A, a cap film 18 for preventing the diffusion of the material forming an interconnection layer 200 to the outside and preventing the oxidation, of the material forming the interconnection layer 200 is formed on it. The cap film 18 also functions as a control layer for etching processing of a second contact layer 300. Note that the cap film 18 need not always be formed.

Subsequently, the second contact layer 300 is formed on the interconnection layer 200. More specifically, a second contact layer insulating film 19 is formed on the interconnection layer 200 by, for example, CVD, and contact holes (not shown) are formed in the second contact layer insulating film 19 by, for example, lithography. In this step, holes are also formed in the cap film 18 in regions where the contact holes are to be formed. A second contact plug 20 is buried in each contact hole by, for example, CVD. To prevent the diffusion of a metal of the conductive material of the second contact plug 20, a barrier metal (not shown) can also be formed on the surface of each contact hole.

Thus, the graphene interconnection according to this embodiment is formed.

In the above-mentioned first embodiment, after the catalyst film 15 is filled in each interconnection trench 30, the graphene layer 16 including a plurality of graphene sheets is formed on the catalyst film 15. That is, the graphene layer 16 need not be formed in the interconnection trench 30. Even when micropatterning of the interconnection trench 30 advances, therefore, graphene sheets can be grown without limiting the number of sheets as long as the graphene layer 16 has the quantum conduction characteristic. This makes it possible to implement a low-resistance interconnection structure.

Also, the catalyst film 15 is filled in each interconnection trench 30 and hence has a relatively large film thickness. Accordingly, it is possible to suppress the formation of the catalyst film 15 as a discontinuous film, and improve the continuity of the graphene layer 16.

The metal (for example, Co or Ni) used as the catalyst film 15 is a material difficult to process by RIE. Since the conventional manufacturing method requires RIE for the catalyst film 15, the restrictions on the process conditions become severer, and the characteristics of the catalyst film 15 deteriorate.

In the manufacturing method according to this embodiment, however, the catalyst film 15 is filled in the interconnection trench 30 by forming the catalyst film 15 on the entire surface, and then etching back the catalyst film 15 by CMP. That is, the above-mentioned problems can be solved because the catalyst film 15 need not be processed by RIE.

[Modification]

A modification of the graphene interconnection according to the first embodiment will be explained below with reference to FIGS. 5A to 7. Note that an explanation of the same features as those of the above-mentioned first embodiment will be omitted, and differences will be explained.

FIGS. 5A to 7 are sectional views of manufacturing steps in the modification of the graphene interconnection according to the first embodiment.

Figure 5A:
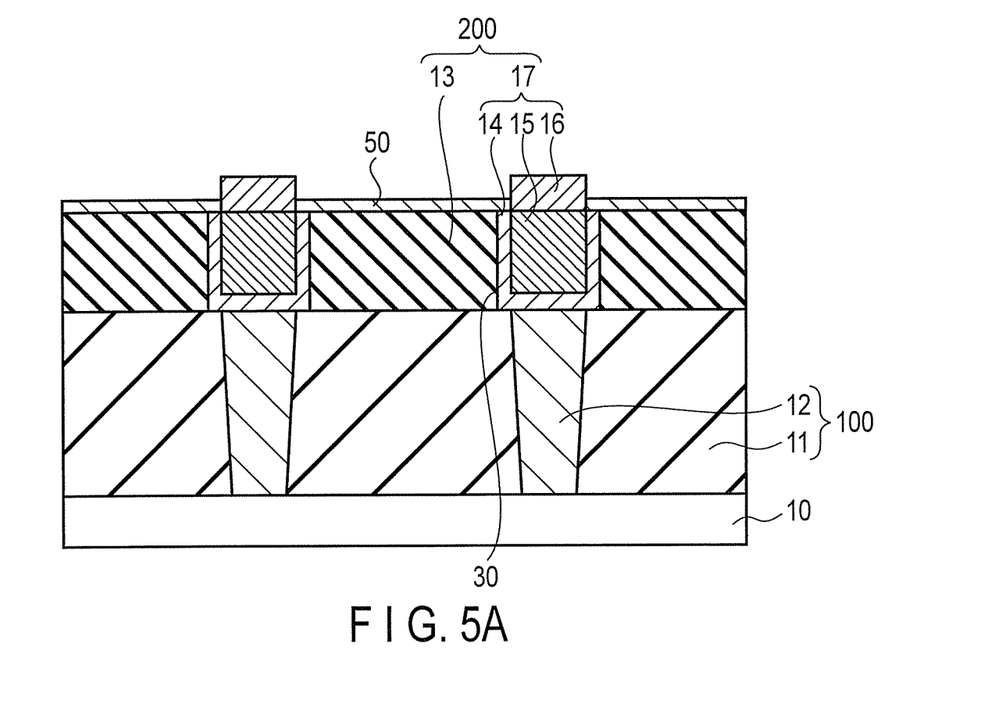

As shown in FIG. 5A, when forming the graphene layers 16 of the interconnection layer 200, a graphene byproduct 50 is formed on the interconnection layer insulating film 13 on the upper surface outside the interconnection trenches 30. The graphene byproduct 50 is a carbon-based compound such as amorphous carbon. The graphene byproduct 50 is conductive, and may cause a leakage current between interconnections.

In this modification, however, the graphene byproduct 50 formed on the interconnection layer insulating film 13 on the upper surface outside the interconnection trenches 30 is removed. This makes it possible to suppress the leakage current caused between interconnections by the graphene byproduct 50.

The removal of the graphene byproduct 50 will be explained below.

First, the manufacturing steps are performed up to the step shown in FIG. 2B. That is, an interconnection layer insulating film 13 is formed on a first contact layer 100.

Figure 5B:
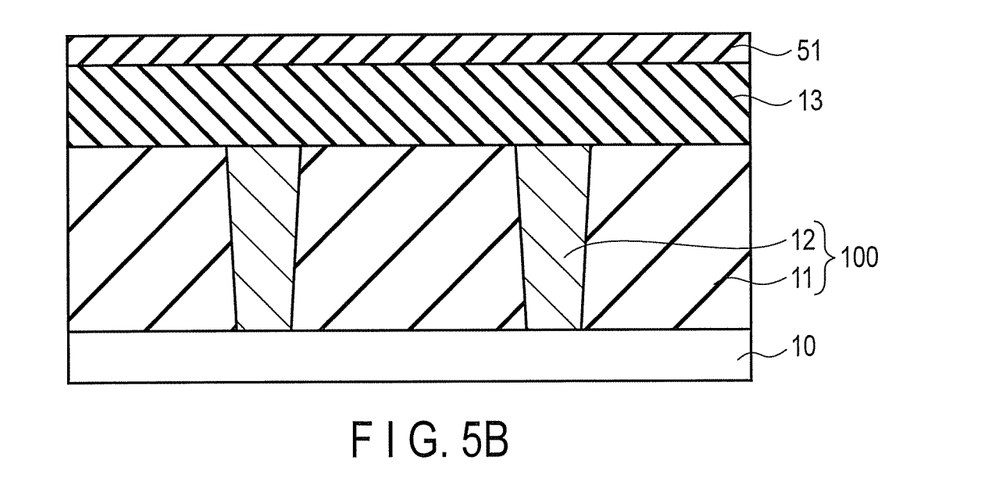

Then, as shown in FIG. 5B, a sacrificial film 51 is formed on the interconnection layer insulating film 13 by, for example, CVD. The sacrificial film 51 is, for example, a low-k film or SiN film.

Figure 6A:
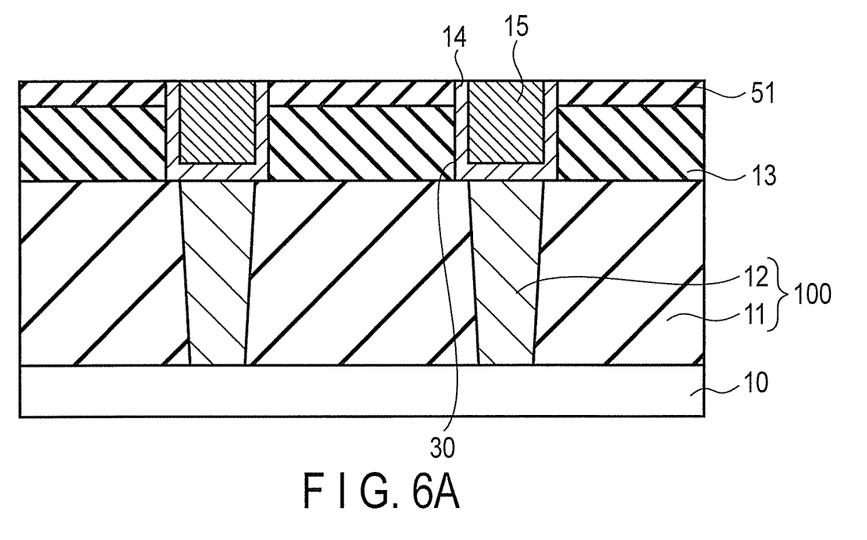

Subsequently, as shown in FIG. 6A, the sacrificial film 51 is coated with a resist (not shown), and lithography is performed. After that, interconnection trenches 30 are formed in the sacrificial film 51 and interconnection layer insulating film 13 by RIE, thereby forming a single-damascene interconnection structure.

A catalyst underlying film 14 is formed on the entire surface by, for example, CVD or PVD. More specifically, the catalyst underlying film 14 is formed on the first contact layer 100 as the bottom surface of each interconnection trench 30, on the interconnection layer insulating film 13 and sacrificial film 51 on the both side surfaces of each interconnection trench 30, and on the sacrificial film 51 on the upper surface except for the interconnection trenches 30. Note that the catalyst underlying film 14 need not always be formed.

Then, a catalyst film 15 is formed on the entire surface by, for example, CVD, PVD, or spraying. More specifically, the catalyst film 15 is formed on the catalyst underlying film 14, and filled in the interconnection trenches 30.

After that, recess is performed by CMP. Consequently, the catalyst underlying film 14 and catalyst film 15 outside the interconnection trenches 30 are recessed, so the upper surfaces of the catalyst underlying film 14 and catalyst film 15 are made level with the upper surfaces of the interconnection trenches 30 (upper surface of the sacrificial film 51).

Figure 6B:
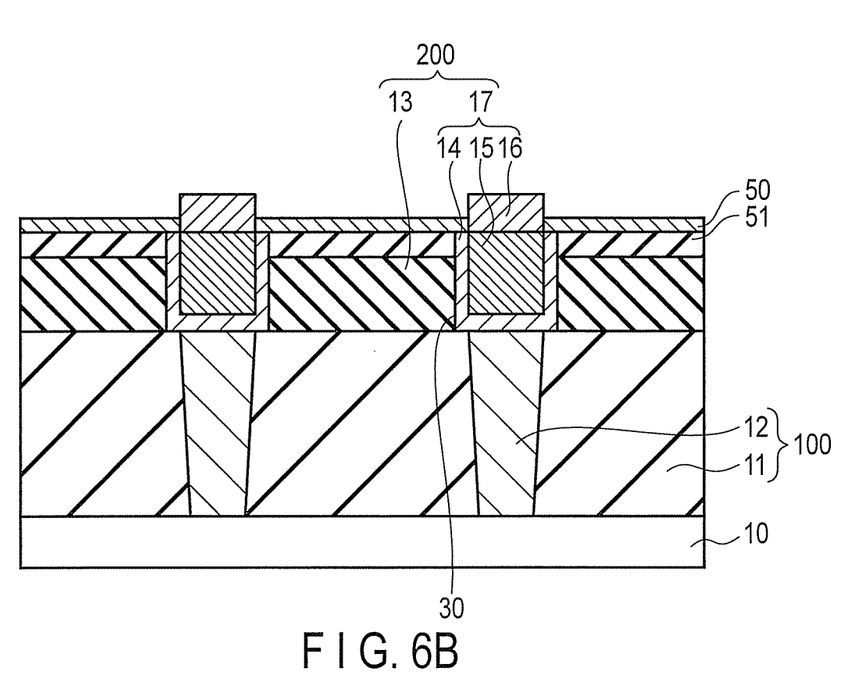

As shown in FIG. 6B, a graphene layer 16 including up to about 100 graphene sheets is formed on the catalyst film 15 in each interconnection trench 30. Since the catalyst film 15 is filled in the interconnection trench 30, the graphene layer 16 grows vertically from the upper surface of the catalyst film 15.

Also, as described above, a graphene byproduct 50 is formed on the sacrificial film 51 outside the interconnection trenches 30 simultaneously with the graphene layers 16.

Figure 7:
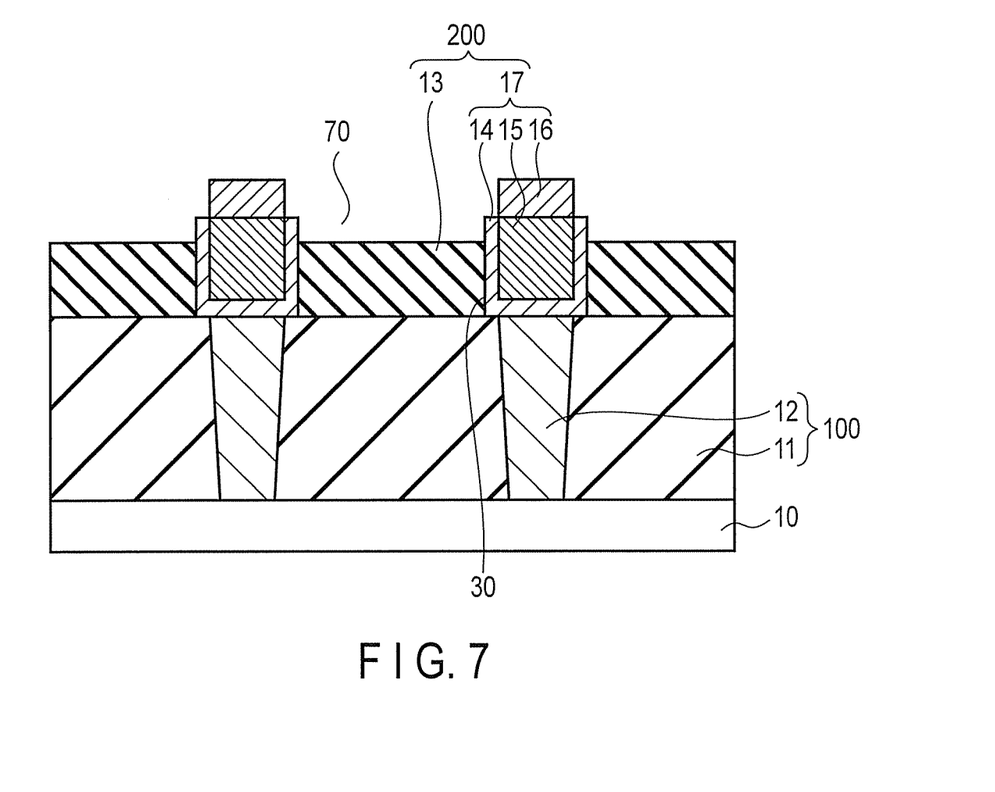

As shown in FIG. 7, the sacrificial film 51 outside the interconnection trenches 30 is removed by wet etching. At the same time, the graphene byproduct 50 formed on the sacrificial film 51 is also removed. In this step, the upper surface of the interconnection layer insulating film 13 becomes lower than the upper surfaces of the catalyst film 15 and catalyst underlying film 14, thereby forming recesses 70 between the interconnection layer insulating film 13 and catalyst underlying film 14. The interconnection 17 which includes the catalyst underlying film 14, the catalyst film 15 and the graphene layers 16 is protruded from the interconnection layer insulating film 13.

Thus, the graphene byproduct 50 that causes a leakage current between interconnections is removed.

Note that the graphene byproduct 50 need not entirely be removed, and it is only necessary to make the graphene byproduct 50 discontinuous between interconnections by partially removing the graphene byproduct 50. Also, the graphene byproduct 50 need not be removed if it is not a cause of the leakage current. Note also that this modification is an example in which the sacrificial film 51 is formed, but the graphene byproduct 50 formed on the interconnection layer insulating film 13 may be removed by RIE without forming the sacrificial film 51.

<Second Embodiment>

A graphene interconnection according to the second embodiment will be explained below with reference to FIGS. 8A to 9B. In the first embodiment, the lower surface of the graphene layer is made level with or higher than the upper surface of the interconnection trench 30. By contrast, the second embodiment is an example in which the lower portion (lower surface side) of a graphene layer is partially formed in an interconnection trench. Note that in the second embodiment, an explanation of the same features as those of the first embodiment will be omitted, and differences will be explained.

[Structure]

Figure 8A:
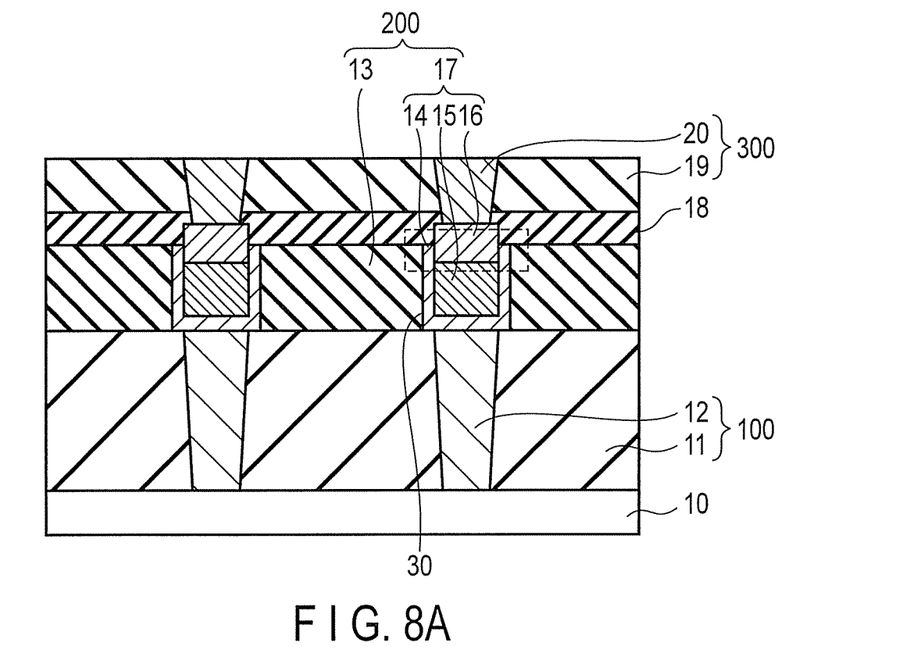
FIGS. 8A and 8B are sectional views showing the structure of a graphene interconnection according to the second embodiment.
Figure 8B:
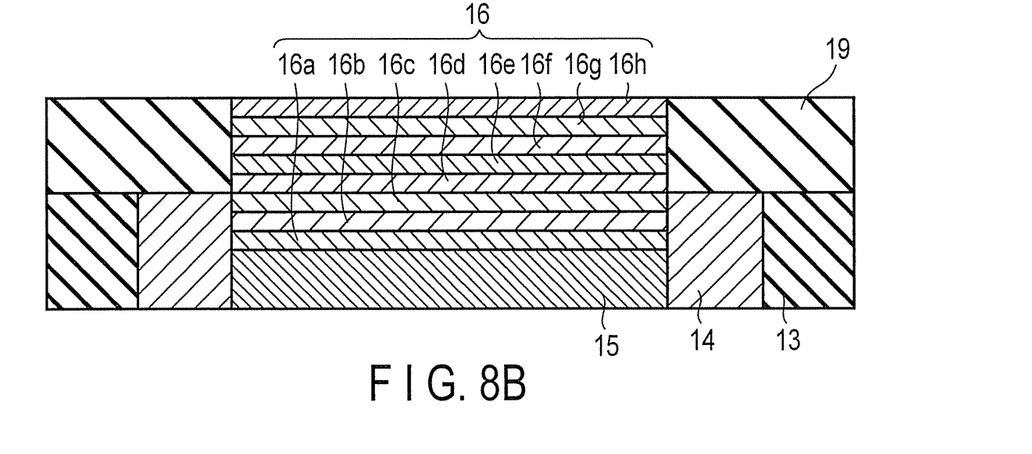

FIG. 8A is a sectional view of the graphene interconnection according to the second embodiment. FIG. 8B is an enlarged view of a dotted-line portion shown in FIG. 8A. Note that a cap film 18 (described later) is not shown in FIG. 8B.

As shown in FIG. 8A, the second embodiment differs from the first embodiment in that a portion of the lower surface side of a graphene layer 16 of an interconnection 17 is formed in an interconnection trench 30. Details of the interconnection 17 according to this embodiment will be explained below.

The interconnection 17 according to this embodiment is formed along each interconnection trench 30, and includes a catalyst underlying film 14, a catalyst film 15, and the graphene layer 16.

The catalyst underlying film 14 is formed on the both sides and bottom surface of each interconnection trench 30. More specifically, the catalyst underlying film 14 is formed on an interconnection layer insulating film 13 on the both side surfaces of the interconnection trench 30, and on a first contact plug 12 as the bottom surface of the interconnection trench 30. That is, the catalyst underlying film 14 is directly connected to the first contact plug 12. Note that in order to improve the conductivity, the catalyst underlying film 14 is desirably a film of a metal such as Ta, Ti, or Ru.

The catalyst film 15 is formed on the catalyst underlying film 14 in each interconnection trench 30, and filled in the lower portion of the interconnection trench 30. The upper surface of the catalyst film 15 is lower than the upper surface of the interconnection trench 30 (upper surfaces of the interconnection layer insulating film 13 and catalyst underlying film 14).

The graphene layer 16 is formed on the catalyst film 15 in each interconnection trench 30, such that the lower portion is formed in the interconnection trench 30, and the upper portion (upper surface side) protrudes from the interconnection trench 30. In other words, the graphene layer 16 has a lower surface lower than the upper surface of the interconnection trench 30 (upper surfaces of the interconnection layer insulating film 13 and catalyst underlying film 14), and an upper surface higher than the upper surface of the interconnection trench 30.

As shown in FIG. 8B, the graphene layer 16 includes a plurality of graphene sheets 16a to 16h vertically stacked on the catalyst film 15 in the interconnection trench 30. In other words, the surfaces of the plurality of graphene sheets 16a to 16h are formed parallel to the bottom surface of the interconnection trench 30. For example, of the plurality of graphene sheets 16a to 16h, the graphene sheets 16a to 16c in the lower portion are formed in the interconnection trench 30, and the graphene sheets 16d to 16h in the upper portion protrude from the interconnection trench 30. That is, the end portions of the graphene sheets 16a to 16c in the lower portion are directly connected to the catalyst underlying film 14. In other words, the end portions of the graphene sheets 16a to 16c are connected to the first contact plug 12 with the catalyst underlying film 14 being interposed between them.

[Manufacturing Method]

Figure 9A:
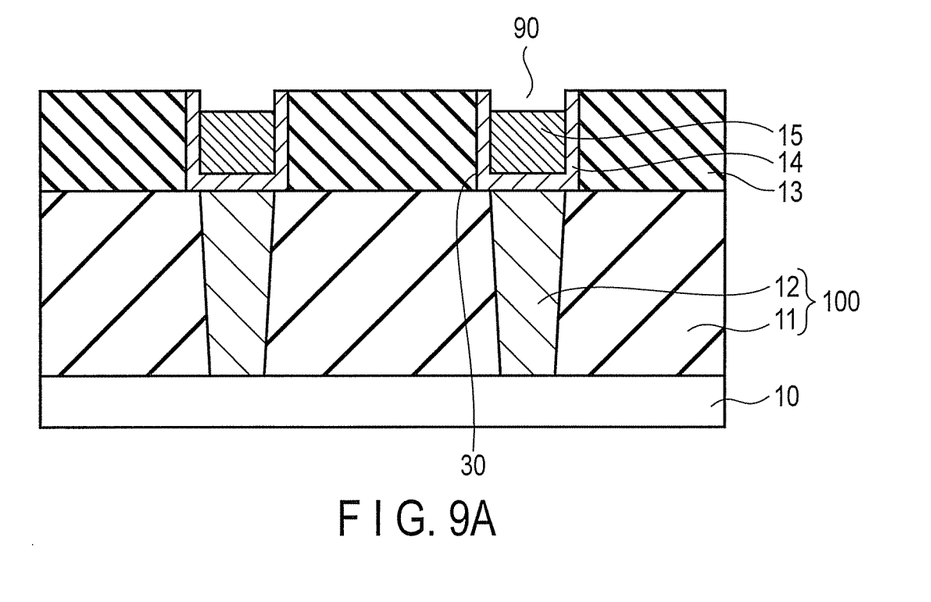
FIGS. 9A and 9B are sectional views showing the manufacturing steps of the graphene interconnection according to the second embodiment.
Figure 9B:
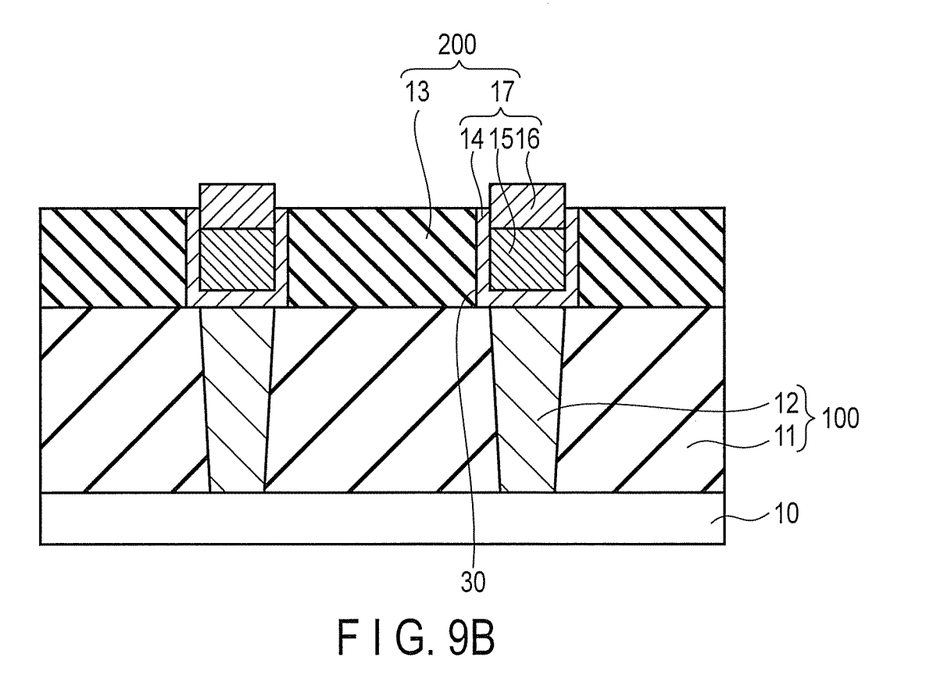

FIGS. 9A and 9B are sectional views of the manufacturing steps of the graphene interconnection according to the second embodiment.

First, the manufacturing steps are performed up to the step shown in FIG. 4A of the first embodiment. That is, a catalyst underlying film 14 and catalyst film 15 outside interconnection trenches 30 are recessed, so the upper surfaces of the catalyst underlying film 14 and catalyst film 15 are made level with the upper surface of each interconnection trench 30 (upper surface of an interconnection layer insulating film 13).

Then, as shown in FIG. 9A, the upper portion of each catalyst film 15 is removed by CMP. Consequently, the upper surface of the catalyst film 15 becomes lower than the upper surface of the interconnection trench 30 (upper surfaces of the interconnection layer insulating film 13 and catalyst underlying film 14), thereby forming a recess 90 between the catalyst film 15 and catalyst underlying film 14.

Subsequently, as shown in FIG. 9B, a graphene layer 16 including up to about 100 graphene sheets are formed on the catalyst film 15 in each interconnection trench 30. In this step, the graphene layer 16 is formed such that the lower portion is formed in the recess 90, and the upper portion protrudes from the interconnection trench 30 (recess 90). In other words, the graphene layer 16 has a lower surface lower than the upper surface of the interconnection trench 30 (upper surfaces of the interconnection layer insulating film 13 and catalyst underlying film 14), and an upper surface higher than the upper surface of the interconnection trench 30.

The rest of the steps are the same as those of the first embodiment, so a repetitive explanation will be omitted.

The above-mentioned second embodiment can achieve the same effects as those of the first embodiment.

In addition, in the second embodiment, the lower portion of the graphene layer 16 is formed in each interconnection trench 30. Of the plurality of graphene sheets forming the graphene layer 16, therefore, the end portions of graphene sheets in the lower portion are directly connected to the catalyst underlying film 14, and connected to the first contact plug 12 with the catalyst underlying film 14 being interposed between them. That is, not only the surface of the lowermost graphene sheet comes in contact with the surface of the catalyst film 15, but also the end portions of the plurality of graphene sheets in the lower portion come in contact with the catalyst underlying film 14 formed on the side surfaces of the interconnection trench 30. This makes it possible to further reduce the interface resistance. This is so because the contact resistance at the end portion of the graphene sheet is lower than that on the surface of the graphene sheet. Accordingly, an interconnection structure having a lower resistance is obtained by electron conduction at the end portion of the graphene sheet in addition to electron conduction on the surface of the graphene sheet.

Note that an interconnection having a sufficiently low resistance can be implemented when the end portions of two or more graphene sheets among the plurality of graphene sheets are directly connected to the catalyst underlying film 14.

<Third Embodiment>

A graphene interconnection according to the third embodiment will be explained below with reference to FIGS. 10, to 11B. The third embodiment is a modification of the second embodiment, and an example in which a graphene layer is entirely formed in an interconnection trench. Note that in the third embodiment, an explanation of the same features as those of the above-mentioned embodiments will be omitted, and differences will be explained.

[Structure]

Figure 10:
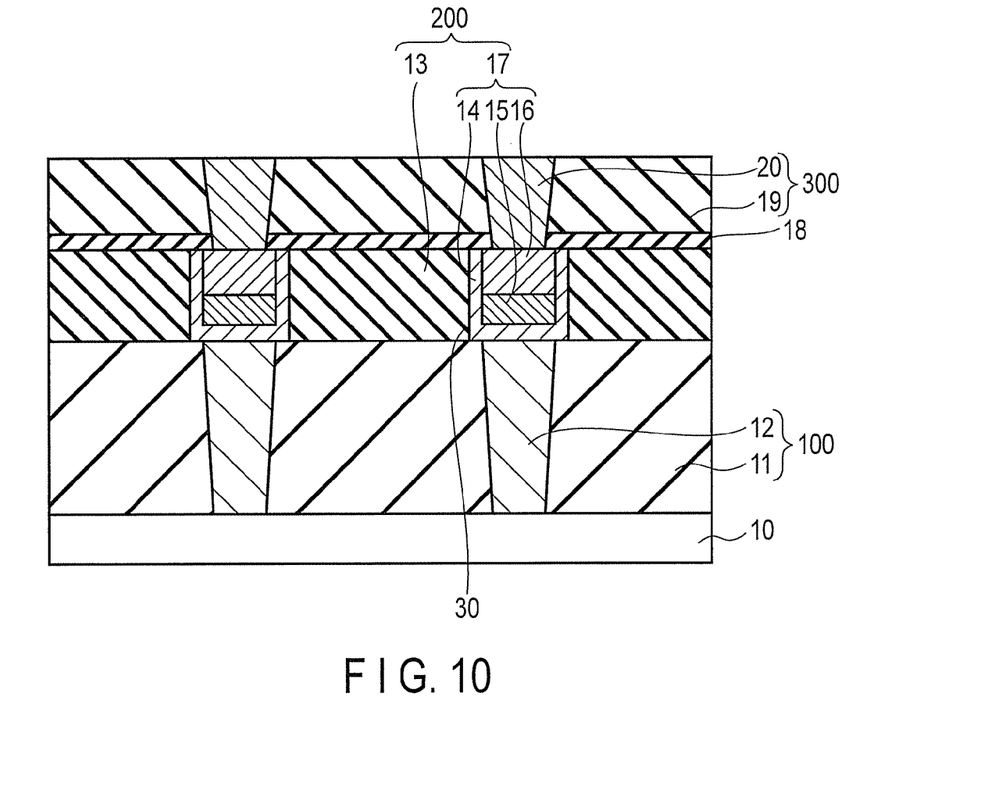
FIG. 10 is a sectional view showing the structure of a graphene interconnection according to the third embodiment.
Figure 11A:
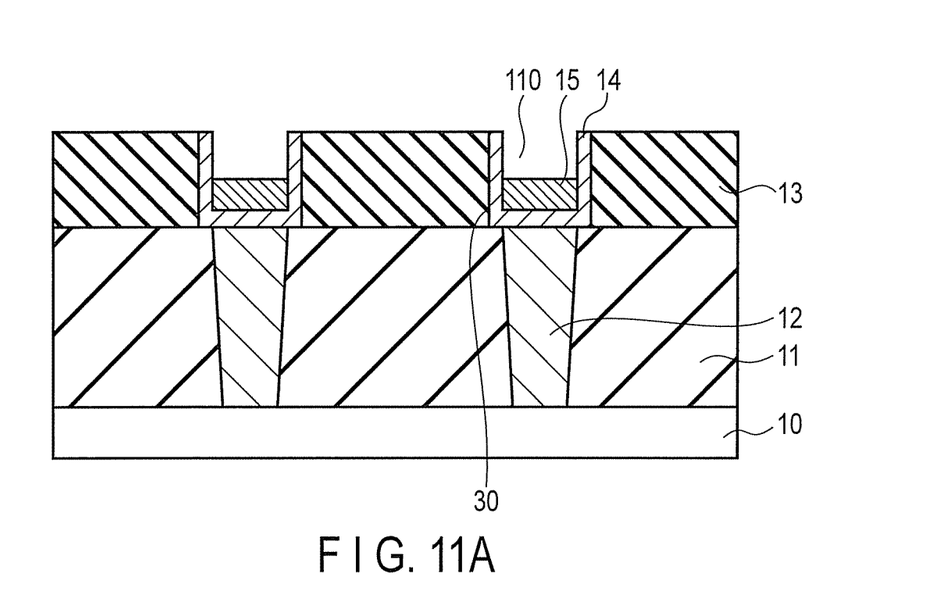
FIGS. 11A and 11B are sectional views showing the manufacturing steps of the graphene interconnection according to the third embodiment.

FIG. 10 is a sectional view of the graphene interconnection according to the third embodiment.

As shown in FIG. 10, the third embodiment differs from the second embodiment in that a graphene layer 16 of an interconnection 17 is entirely formed in an interconnection trench 30. The details will be explained below.

The interconnection 17 according to this embodiment is formed along each interconnection trench 30, and includes a catalyst underlying film 14, a catalyst film 15, and the graphene layer 16.

The catalyst underlying film 14 is formed on the both side surfaces and bottom surface of each interconnection trench 30. More specifically, the catalyst underlying film 14 is formed on an interconnection layer insulating film 13 on the both side surfaces of the interconnection trench 30, and on a first contact plug 12 as the bottom surface of the interconnection trench 30. That is, the catalyst underlying film 14 is directly connected to the first contact plug 12.

The catalyst film 15 is formed on the catalyst underlying film 14 in each interconnection trench 30, and filled in the lower portion of the interconnection trench 30. The upper surface of the catalyst film 15 is lower than the upper surface of the interconnection trench 30 (upper surfaces of the interconnection layer insulating film 13 and catalyst underlying film 14).

Also, the upper surface of the catalyst film 15 according to this embodiment is desirably lower than the upper surface of the catalyst film 15 according to the second embodiment.

The graphene layer 16 is formed on the catalyst film 15 in each interconnection trench 30, and entirely buried in the interconnection trench 30. That is, the upper surface of the graphene layer 16 is made level with or lower than the upper surface of the interconnection trench 30 (upper surfaces of the interconnection layer insulating film 13 and catalyst underlying film 14).

The graphene layer 16 includes a plurality of graphene sheets vertically stacked on the catalyst film 15 in the interconnection trench 30. All the plurality of graphene sheets are formed in the interconnection trench 30. That is, the end portions of all the graphene sheets are directly connected to the catalyst underlying film 14. In other words, the end portions of all the graphene sheets are connected to the first contact plug 12 with the catalyst underlying film 14 being interposed between them.

[Manufacturing Method]

Figure 11B:
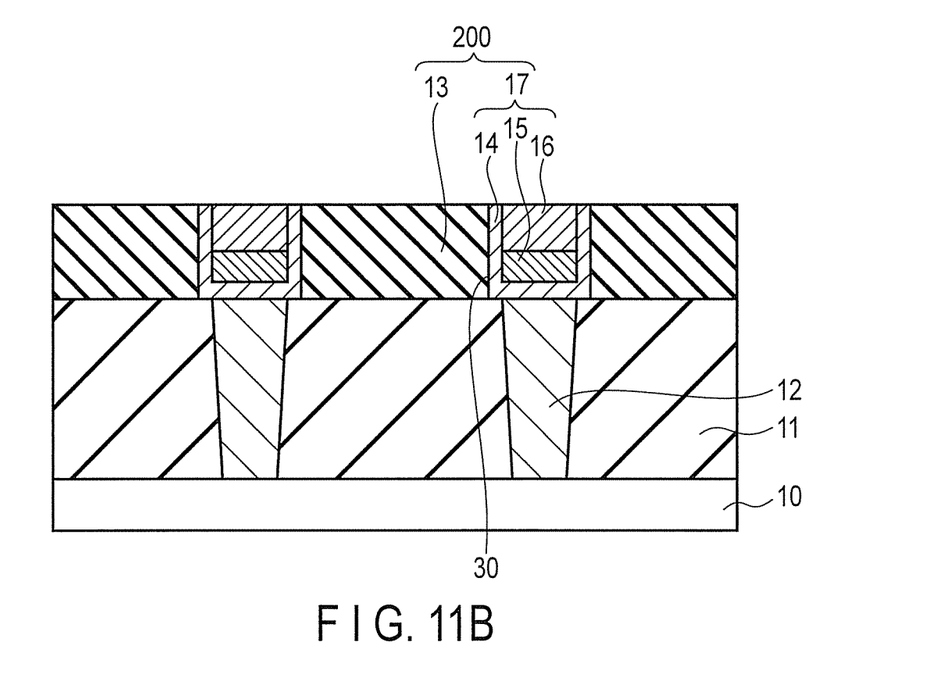

FIGS. 11A and 11B are sectional views of the manufacturing steps of the graphene interconnection according to the third embodiment.

First, the manufacturing steps are performed up to the step shown in FIG. 4A of the first embodiment. That is, a catalyst underlying film 14 and catalyst film 15 outside interconnection trenches 30 are recessed, so the upper surfaces of the catalyst underlying film 14 and catalyst film 15 are made level with the upper surface of each interconnection trench 30 (upper surface of an interconnection layer insulating film 13).

Then, as shown in FIG. 11A, the upper portion of each catalyst film 15 is removed by CMP. Consequently, the upper surface of the catalyst film 15 becomes lower than the upper surface of the interconnection trench 30 (upper surfaces of the interconnection layer insulating film 13 and catalyst underlying film 14), thereby forming a recess 110 between the catalyst film 15 and catalyst underlying film 14. The recess 110 is formed deeper than the recess 90 of the second embodiment.

Subsequently, as shown in FIG. 11B, a graphene layer 16 including up to about 100 graphene sheets are formed on the catalyst film 15 in each interconnection trench 30. In this step, the graphene layer 16 is formed such that the upper surface is made level with or lower than the upper surface of the interconnection trench 30 (recess 110).

The rest of the steps are the same as those of the first embodiment, so a repetitive explanation will be omitted.

The above-mentioned third embodiment can achieve the same effects as those of the second embodiment.

In addition, in the third embodiment, the graphene layer 16 is entirely buried in the interconnection trench 30. Therefore, the end portions of all the plurality of graphene sheets forming the graphene layer 16 are directly connected to the catalyst underlying film 14, and connected to the first contact plug 12 with the catalyst underlying film 14 being interposed between them. Since all the graphene sheets can thus contribute to electron conduction, it is possible to implement an interconnection structure having a resistance lower than that of the second embodiment.

Also, since the upper surface of the graphene layer 16 is made level with or lower than that of the catalyst underlying film 14, a second contact plug 20 can directly be connected to the catalyst underlying film 14. Accordingly, the second contact plug 20 is also connected to all the graphene sheets with the catalyst underlying film 14 being interposed between them. This makes it possible to use a material having a high contact resistance with respect to a graphene sheet, as the material of the second contact plug 20. Therefore, the range of selection of the material to be used as the second contact plug 20 widens.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene interconnection comprising:
an insulating film including an interconnection trench;
a catalyst underlying film formed on both side surfaces and the bottom surface of the interconnection trench;
a catalyst film formed on the catalyst underlying film in the interconnection trench and filling at least a portion of the interconnection trench; and
a graphene layer formed on the catalyst film in the interconnection trench, and including graphene sheets stacked in a direction perpendicularly to a bottom surface of the interconnection trench,
wherein the graphene layer has an upper surface higher than an upper surface of the interconnection trench, and a lower surface lower than the upper surface of the interconnection trench,
an end portion of a lower portion of the graphene layer is directly contact with the catalyst underlying film, and
among the graphene sheets forming the graphene layer, end portions of not less than two graphene sheets are directly contact with the catalyst underlying film.

2. The interconnection of claim 1, wherein the catalyst underlying film includes one of Ta, Ti, and Ru.

3. The interconnection of claim 1, wherein the plurality of graphene sheets comprise between two and 100 graphene sheets.

4. The interconnection of claim 1, wherein the catalyst film comprises a continuous film.

5. The interconnection of claim 4, wherein a film thickness of the catalyst film is not less than 0.5 nm.

6. The interconnection of claim 1, wherein the catalyst film comprises one of a film of a metal selected from the group consisting of Co, Ni, Fe, Ru, and Cu, a film of an alloy containing at least one of Co, Ni, Fe, Ru, and Cu, and a film of a carbide of any of Co, Ni, Fe, Ru, and Cu.

7. The interconnection of claim 1, wherein the graphene layer has a line shape in a plan view.

8. A graphene interconnection comprising:
an insulating film including an interconnection trench;
a catalyst underlying film formed on both side surfaces and the bottom surface of the interconnection trench,
a catalyst film formed on the catalyst underlying film in the interconnection trench and filling at least a portion of the interconnection trench; and
a graphene layer formed on the catalyst film in the interconnection trench, the graphene layer being a form of a plate, and the graphene layer including graphene sheets stacked in a first direction the first direction perpendicularly to a bottom surface of the interconnection trench,
wherein the graphene layer has an upper surface higher than an upper surface of the interconnection trench, and a lower surface lower than the upper surface of the interconnection trench, and
an end portion of a lower portion of the graphene layer is directly contact with the catalyst underlying film.

9. The interconnection of claim 8, wherein the graphene sheets are stacked only in the first direction.

10. The interconnection of claim 8, wherein end portions of not less than two graphene sheets and an end portion of the catalyst film are on a same plane.

11. A graphene interconnection comprising:
an insulating film including a trench;
a catalyst underlying film formed on both side surfaces and the bottom surface of the trench;
a catalyst film formed on the catalyst underlying film in the trench and filling at least a portion of the interconnection trench; and
a graphene layer formed on the catalyst film in the interconnection trench, and including graphene sheets stacked in a direction non-parallel to a bottom surface of the trench,
wherein the graphene layer has an upper surface higher than a lower surface lower than the upper surface of the trench,
a lower portion of the graphene layer is directly in contact with the catalyst underlying film.

12. The interconnection of claim 11, wherein the graphene layer has an upper surface higher than an upper surface of the trench.

13. The interconnection of claim 11, wherein side end portions of a lower portion of the graphene layer is directly contact with the catalyst underlying film.

14. The interconnection of claim 11, wherein among the graphene sheets forming the graphene layer, end portions of not less than two graphene sheets are directly contact with the catalyst underlying film.

15. The interconnection of claim 11, wherein the catalyst underlying film includes one of Ta, Ti, and Ru.

16. The interconnection of claim 11, wherein the graphene sheets comprise between two and 100 graphene sheets.

17. The interconnection of claim 11, wherein the catalyst film comprises a continuous film.

18. The interconnection of claim 17, wherein a film thickness of the catalyst film is not less than 0.5 nm.

19. The interconnection of claim 11, wherein the catalyst film comprises one of a film of a metal selected from the group consisting of Co, Ni, Fe, Ru, and Cu, a film of an alloy containing at least one of Co, Ni, Fe, Ru, and Cu, and a film of a carbide of any of Co, Ni, Fe, Ru, and Cu.

20. The interconnection of claim 11, wherein end portions of not less than two graphene sheets and an end portion of the catalyst film are on a same plane.

* * * * *